United States Patent
Wik

(10) Patent No.: US 7,746,921 B1
(45) Date of Patent: Jun. 29, 2010

(54) RESONANT DIGITAL DATA TRANSMISSION

(76) Inventor: Thomas Robert Wik, 1790 Verdite St., Livermore, CA (US) 94550

( * ) Notice: Subject to any disclaimer, the term of this patent is extended or adjusted under 35 U.S.C. 154(b) by 931 days.

(21) Appl. No.: 11/546,184

(22) Filed: Oct. 11, 2006

Related U.S. Application Data

(60) Provisional application No. 60/725,339, filed on Oct. 11, 2005.

(51) Int. Cl.
*H04B 13/02* (2006.01)

(52) U.S. Cl. ............... 375/218; 327/108; 327/111; 327/110; 327/82; 327/83; 327/168; 327/382; 327/389; 327/88

(58) Field of Classification Search ............ 375/218; 327/111, 110, 82, 83, 108, 168, 382, 389, 327/88

See application file for complete search history.

(56) References Cited

U.S. PATENT DOCUMENTS

| | | | | |
|---|---|---|---|---|
| 5,734,285 A | * | 3/1998 | Harvey | 327/291 |
| 6,140,848 A | * | 10/2000 | Harvey | 327/112 |
| 6,201,420 B1 | * | 3/2001 | Harvey | 327/109 |
| 6,922,075 B1 | * | 7/2005 | Morley | 326/30 |
| 2001/0004387 A1 | * | 6/2001 | Barkar | 375/257 |
| 2002/0183035 A1 | * | 12/2002 | Glasbrener et al. | 455/341 |
| 2004/0145411 A1 | * | 7/2004 | Harvey | 330/251 |

* cited by examiner

*Primary Examiner*—David C Payne
*Assistant Examiner*—Zewdu Kassa

(57) ABSTRACT

Power savings are achieved for digital data transport over short distances by using the characteristics of resonant LC circuits. Economy of circuit elements is achieved by enabling a single pair of resonant circuits to drive large numbers of digital data lines or nodes in parallel. This maximizes power efficiency and minimizes area and cost. Resistance is minimized by insuring that all switches in the current path are fully "ON" whenever significant current is flowing through them. All other parasitic resistances in the circuits, consisting primarily of parasitic interconnect resistances, are minimized. This enables the data transmission circuits to achieve maximum Q or quality factor, which minimizes power dissipation.

11 Claims, 10 Drawing Sheets

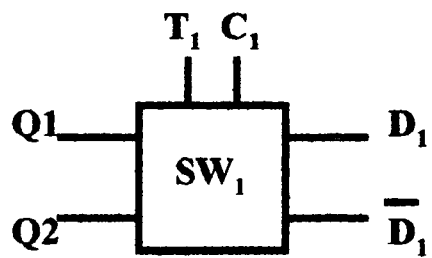
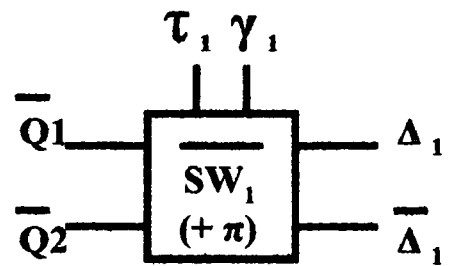
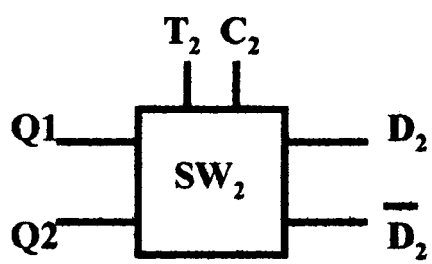
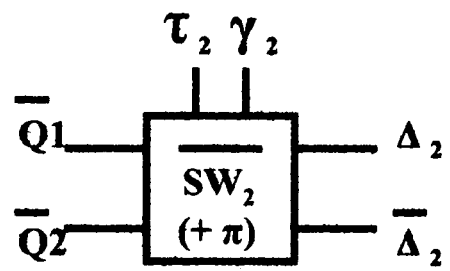
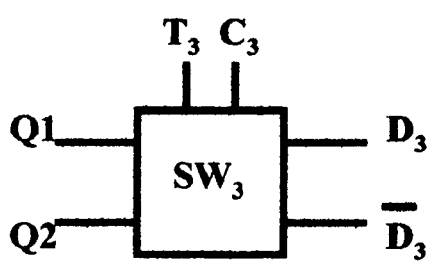
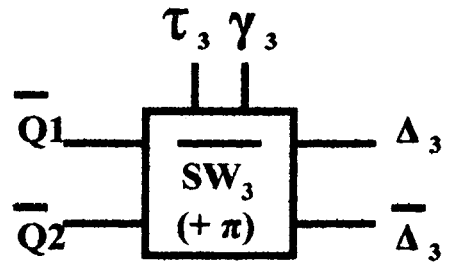
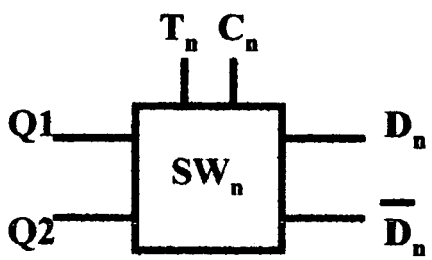
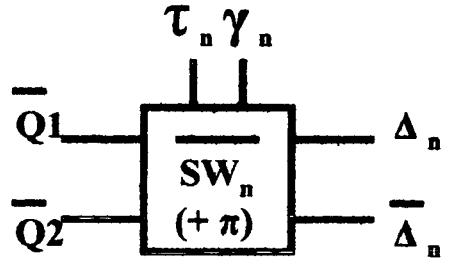
Fig 9A      Fig 9B

RESONANT DIGITAL DATA TRANSMISSION

CROSS-REFERENCE TO RELATED APPLICATIONS

This application claims the benefit of provisional patent application Ser. No. 60/725,339 filed 2005 Oct. 11 by the present inventor.

FEDERALLY SPONSORED RESEARCH

Not Applicable

SEQUENCE LISTING OF PROGRAM

Not Applicable

BACKGROUND OF THE INVENTION

1. Field of Invention

This invention relates to digital circuits, specifically to driver circuits for digital data transmission from one physical location to another either on a single integrated circuit or between one or more integrated circuits.

2. Prior Art

Digital input/output circuits used for digital data transmission in integrated circuits in prior art are all dissipative. This means that the electrical energy used to change the potential at the input of the receiving circuits is dissipated as heat each time the data state is changed. In the case of prior art that uses electrical current sensing techniques, all of the energy associated with the current used for signaling is continuously dissipated as heat. Output drivers used in prior art do not recycle charge and make use of energy stored in electric and magnetic fields. This includes all of the input/output standards currently in use such as Low Voltage Transistor-Transistor Logic (LVTTL), Low Voltage Differential Signaling (LVDS), Low Voltage Pseudo Emitter Coupled Logic (LVPECL), High Speed Transceiver Logic (HSTL), Stub Series Terminated Logic (SSTL), Transition Minimized Differential Signaling (TMDS), and so forth.

Power dissipation scales as the square of the voltage; hence, it is desirable to keep the operating voltage as low as possible while still allowing adequate signal to reliably sense the data states on the data lines. This is the reason for using the lowest possible voltage for low-power digital data transmission. Generally the minimum voltage that can be used is determined by the sensitivity of the input or receiving circuitry and the noise level in the environment of the receiving circuitry. Sensing of the data states at the receiving end of the data lines is achieved using any conventional sensing circuits contained in prior art such as a latching sense amplifier. An example of a conventional receiver circuit is included in U.S. Pat. No. 6,426,656 issued 2002 Jul. 30 to William Dally et. al. entitled High Speed, Low-Power Inter-Chip Transmission System. This patent is also a good example of prior art for low-power data transmission in a crossbar switch. In this prior art the amplitude of the differential signals on the data lines is minimized, but the charge required to effect the changes in potentials on the data lines is discharged on every cycle and the energy contained in the electric field of the parasitic capacitances is dissipated as heat energy on every cycle.

Minimizing power dissipation is an important objective for all integrated circuits, but it is especially important for battery-powered applications. Prior art has minimized power dissipation by minimizing the operating voltage, maximizing the sensitivity of the input or receiving circuitry, minimizing noise, and minimizing parasitic capacitances. The electrical energy associated with the currents and/or charge displacements that represent the digital signal outputs in prior art are dissipated as heat during each change of data state.

OBJECTS AND ADVANTAGES

This invention achieves additional power savings over prior art by applying resonant Inductor (L), Capacitor (C), Resistor (R) circuits to the data output drivers for digital data transmission from one physical location to another. These new resonant data drivers recycle charge and conserve the electrical energy contained in the electric fields of the parasitic capacitances and the energy contained in the magnetic fields of the inductors. Resistance (R) causes dissipation of electrical energy and is minimized in preferred embodiments of this invention. Resonant data drivers have application wherever digital data must be transported from one physical location to another over short distances. This includes on-chip data paths and Input/Output for data transmission between ICs. An object of this invention is to apply resonant circuits to digital data driver circuits thereby providing the advantage of lower power dissipation compared to prior art. This enhancement can be applied in conjunction with other power reduction techniques of low voltage, low noise, high input sensitivity, and minimization of parasitic capacitances and resistances. The advantage is to augment the power savings of prior art to achieve a substantial further reduction in power dissipation.

Resonant circuits generate changes in electrical potential across the circuit elements (L, C, and R) without dissipating all the energy of the electric field in the capacitor(s), C, or the magnetic field energy in the inductor(s), L. Energy dissipation occurs only in the resistance, R, associated with the resonant circuit. Q is a measure of Quality factor of the resonant circuit. It is defined as the fractional energy dissipation per cycle ($=2\pi/Q$), where $Q=\omega L/R$, $\omega$ is the angular frequency of oscillation, $\omega=2\pi f$, where f is the frequency of oscillation. In prior art the full charge that is required to charge up the capacitance on each data line is dissipated in every cycle. Thus $2\pi/Q$ represents the fractional energy dissipation of Resonant Digital Data Transmission compared to prior art for equivalent voltage swings. High-frequency resonant circuits can achieve Qs that are on the order of 100 which would correspond to a power savings of more than a factor of 10.

Another object of this invention is to provide a simple economical means for applying resonant circuits to digital data transmission on and between integrated circuits. Resonant circuits produce repetitive oscillatory voltage and current outputs, which by themselves do not convey any information. These circuits are harnessed for impressing meaningful digital data on these oscillatory signals by connecting these signals through switches to the data lines. Each digital data line is driven by a simple pair of switches that connect the data line to one or the other of a pair of resonant circuits depending on the control signals applied on the two switches. The data state will depend on which resonant circuit is connected to the data line through the ON switch. This simple implementation makes layout and control very efficient thereby reducing layout area which is another very critical goal of all digital circuits.

Another object of this invention is economy of circuit elements required for implementation of resonant digital data driver circuits. This is achieved by enabling a single pair of resonant circuits to drive large numbers of digital data lines or nodes in parallel. A single pair of resonant driver circuits can be attached to a large number of digital data lines connected in parallel through individual switches. Multiple pairs of data switches can be connected in parallel with a single pair of resonant circuits thereby reducing the effective parallel resistance. This also helps to maximize the power efficiency of this invention since the Q of the circuit varies inversely with the resistance. As the effective resistance is reduced by placing many resistive data lines and resistive switches in parallel, the Q is increased and the fractional energy lost per cycle is reduced.

This invention achieves further reduction in effective resistance by insuring that all transistors used to implement switches and to implement forcing circuits for the resonant circuits are fully ON whenever current is flowing and fully OFF whenever current is not supposed to flow. All other parasitic resistances in the circuits, consisting primarily of parasitic interconnect resistances, are minimized. This enables the resonant data driver circuit to achieve maximum Q or quality factor. This results in a minimum fraction of the energy being dissipated in each cycle.

Another object of this invention achieved by one of the preferred embodiments is to generate two pairs of resonant data driver circuits that operate 180 degrees out of phase with respect to each other. This makes it possible to latch data signals from one pair of resonant driver circuits while the data signal from this pair is at a maximum and the outputs from the complementary driver circuits are equilibrated at the same voltage. This is just the timing relationship desired for using the latched signals from the first pair of resonant driver circuits to control the switches for the second pair of resonant data driver circuits. The switches connected to the resonant driver circuits must change state during the time when the outputs of the pair of resonant driver circuits are substantially equal in voltage. Otherwise, the switches will be in a high impedance state while current is flowing through the switches, which is undesirable for minimum power dissipation. Thus this phasing of two pairs of resonant driver circuits is what is needed for a repeater or a buffer for a digital signal line that runs over a distance that requires buffering. Moreover, this preferred embodiment generates two pairs of resonant driver circuits with only two inductors. This enables good economy of device elements for implementing the resonant driver circuits which saves area and cost.

SUMMARY

Resonant digital data transmission is achieved by operating two resonant circuits 180 degrees ($\pi$ radians) out of phase between three different power-supply voltages. One resonant driver circuit operates between a highest voltage V1 and an intermediate voltage V2 and the other resonant driver circuit operates between the same intermediate voltage V2 and a lowest voltage V3. The resonant circuits are controlled by a forcing circuit that sets the frequency and phase of the outputs and can synchronize the outputs in frequency and phase to any desired clock domain on an integrated circuit. This enables convenient timing of switches for impressing data on the data lines and for timing the input circuits that receive the data from each data line. Each resonant driver circuit has a switch that connects it to each of the data lines. Since the resonant circuits are operating 180-degrees out of phase with each other, there will be one point in time in each cycle when both outputs are at the same intermediate potential V2. This is the time when switches connected to the outputs of the two resonant circuits are reset to the proper state to drive each digital data line connected to them either HIGH to the highest voltage V1 or LOW to the lowest voltage V3. Thus each data line can be driven either HIGH or LOW depending on which switch is ON. The HIGH or LOW data state on each data line is attained one-half cycle or 180 degrees after the switches are set to the proper state to drive the desired data on each data line. At this instant in time, when the data lines attain the maximum or minimum voltage at the receiver or input, the data can be latched by conventional means described in prior art. Power dissipation is substantially reduced because the resonant circuit conserves energy stored in the inductor and in the capacitance of the data lines. Resistance is low at all times when current is flowing since the switches only change state when all data lines and both resonant driver circuit outputs are all at the same voltage V2. This maximizes the Q factor of the circuit which minimizes the fractional energy loss during each cycle. The inductance value of the inductors used in the resonant circuits is selected so the resonant frequency of the resonant circuits including the capacitance of the switches and data lines is substantially equal to the data rate required for digital transmission in the system.

DRAWINGS

Figures

Figure 7A:
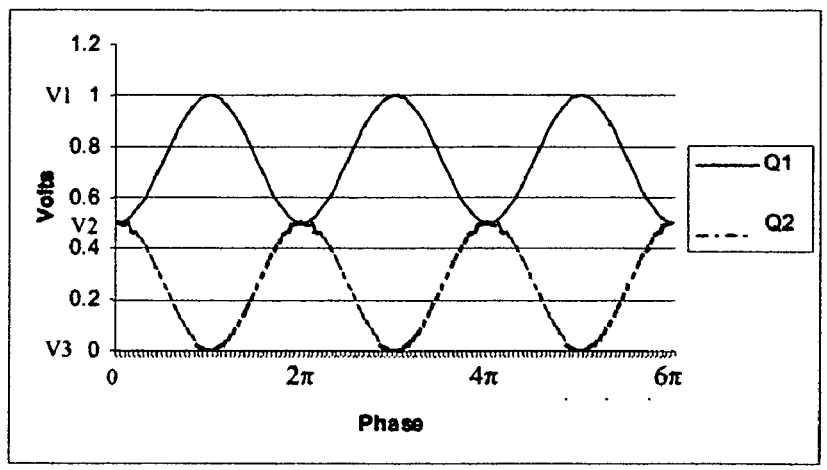
Figure 7B:
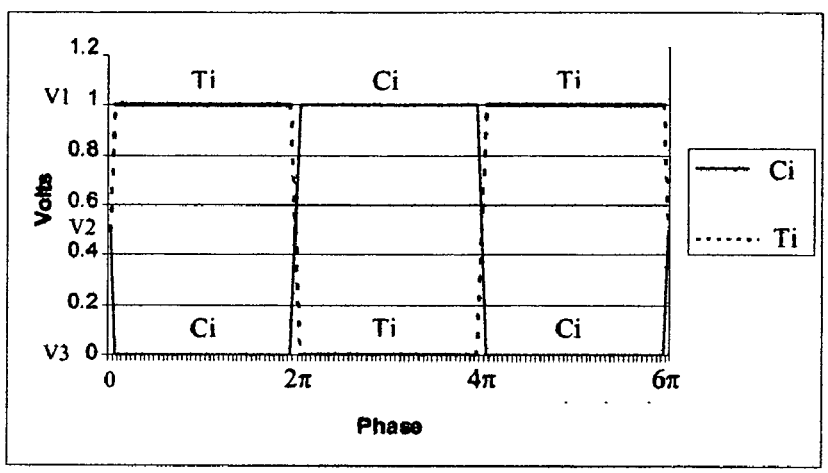
Figure 7C:
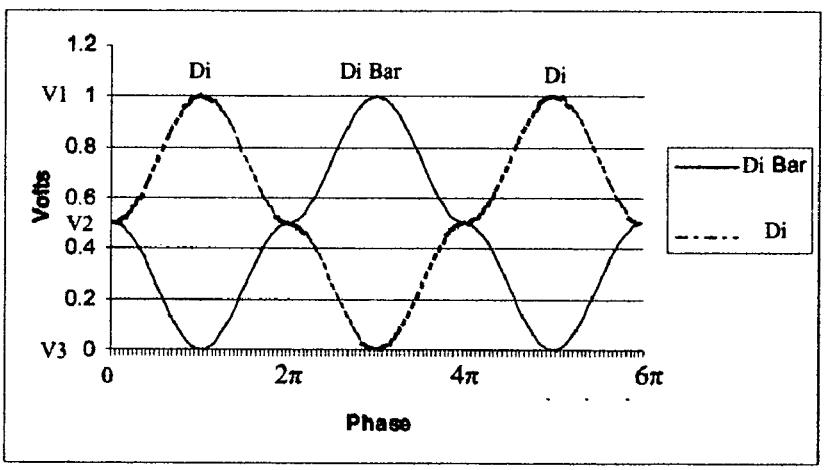

FIG. 7A, FIG. 7B, and FIG. 7C show the waveforms for Q1 and Q2, the control signals $T_i$ and $C_i$ for the switch, and the data line outputs $D_i$ and $D_i$ Bar, respectively.

Figure 8A:
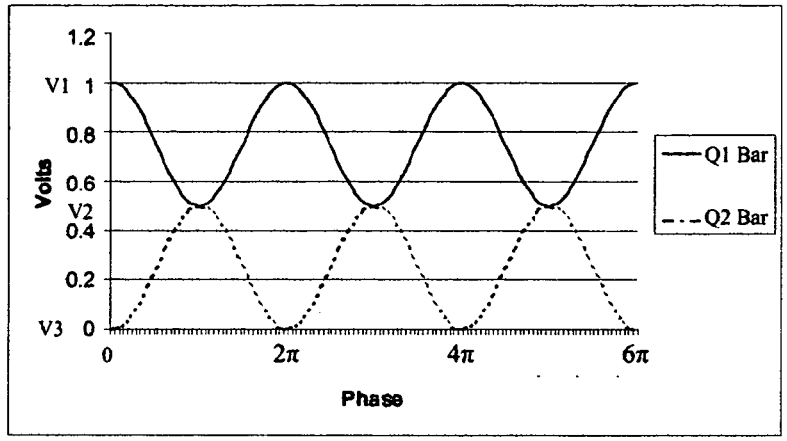
Figure 8B:
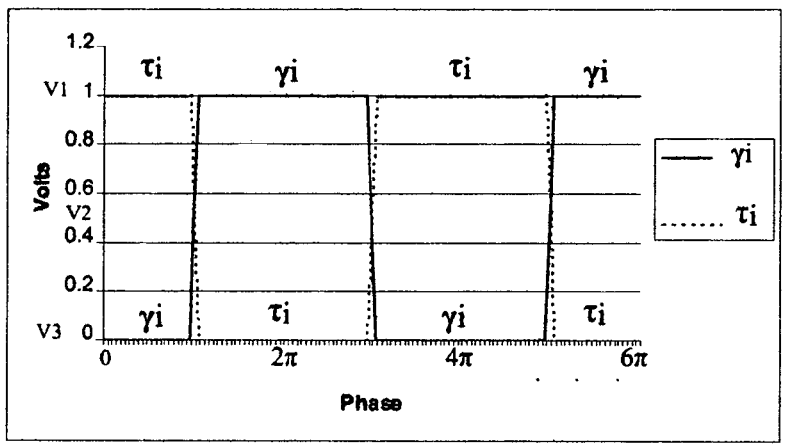
Figure 8C:
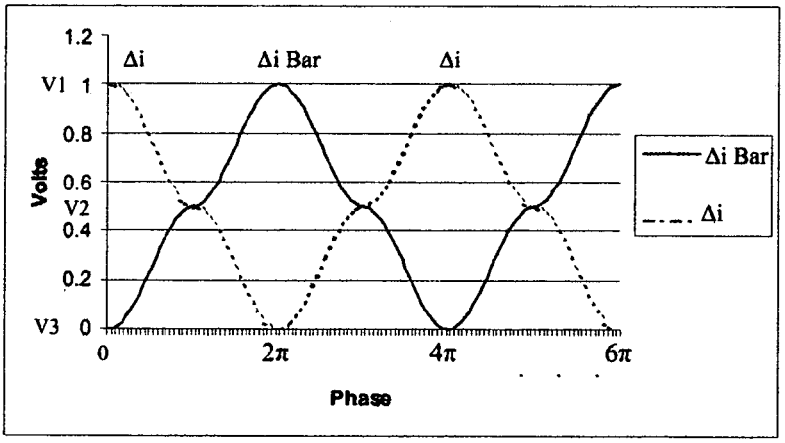

FIG. 8A, FIG. 8B, and FIG. 8C show the waveforms for Q1 Bar and Q2 Bar, the control signals $\tau_i$ and $\gamma_i$ for the switch, and the data line outputs $\Delta_i$ and $\Delta_i$ Bar, respectively.

FIG. 9 shows an array of data line switch circuits for n differential data line pairs connected in parallel to Q1 and Q2 and n differential data line pairs connected in parallel to Q1 Bar and Q2 Bar.

Figure 10A:
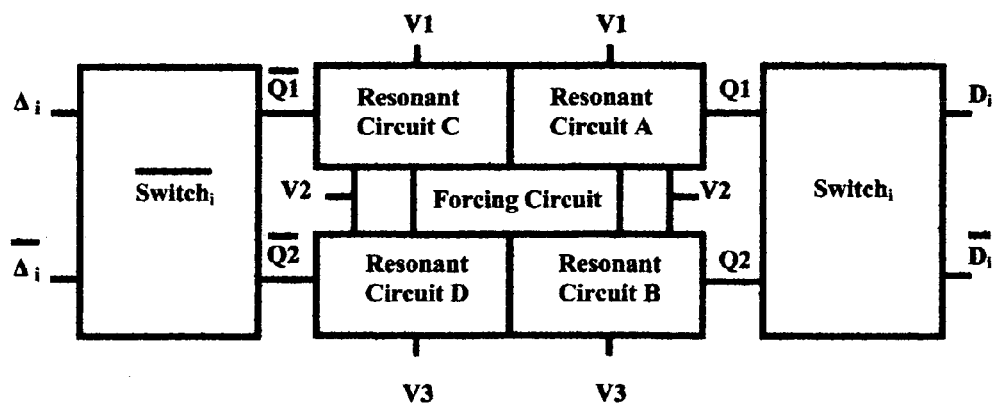
Figure 10B:
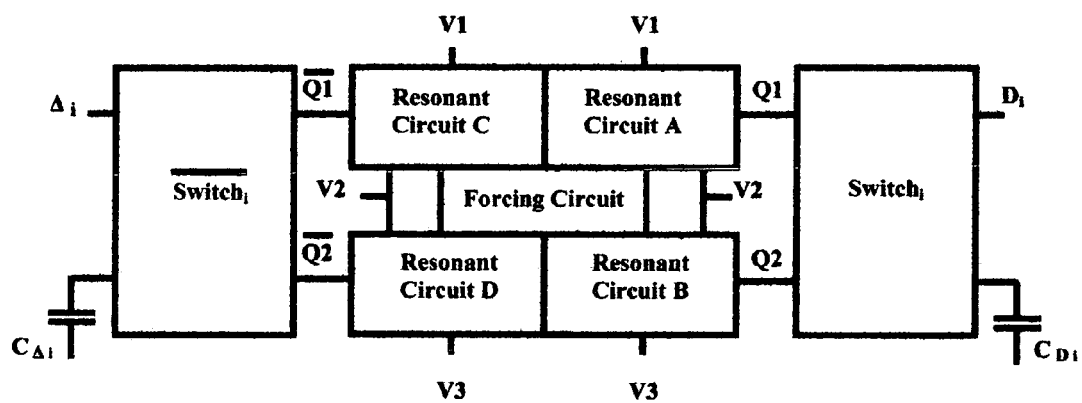

FIG. 10A and FIG. 10B provide an overview of the circuit architecture for resonant driver circuits with two complementary pairs of outputs driving two sets of differential data lines and two sets of single-ended data lines, respectively.

DETAILED DESCRIPTION

Figure 1:
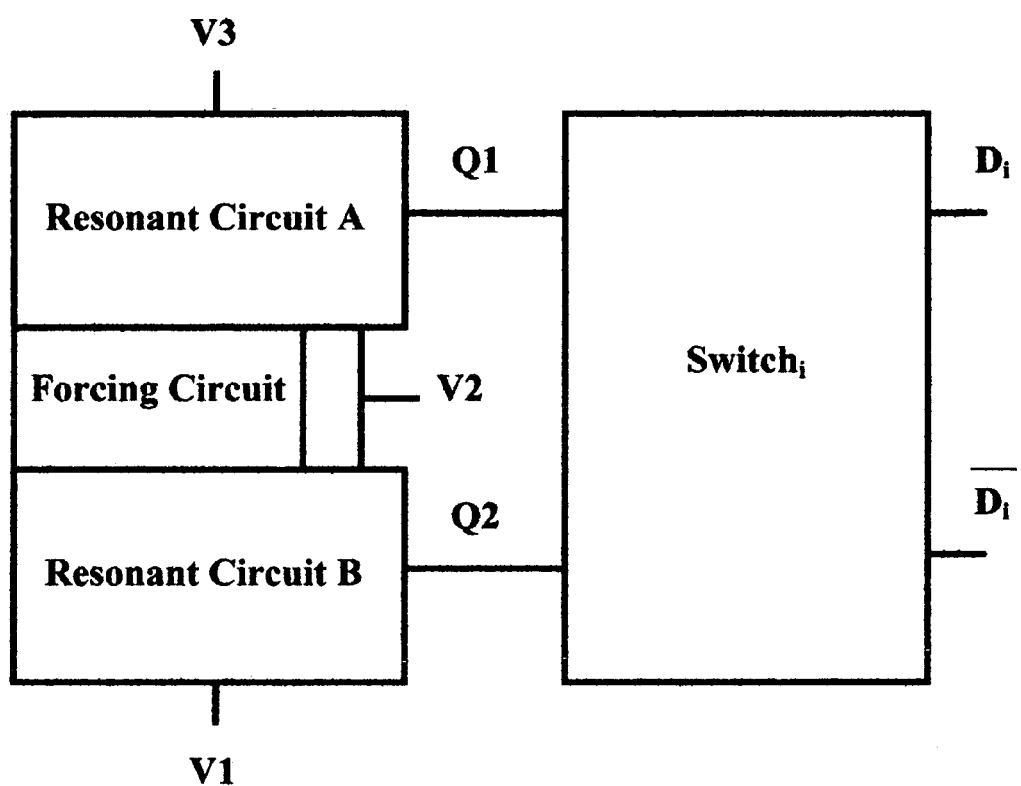
FIG. 1 shows the basic configuration of two resonant circuits A and B driving output Q1 between potentials V2 and V1 and output Q2 between potentials V3 and V2, respectively, and these outputs are connected through a switch to true and complement differential data lines.
Figure 2:
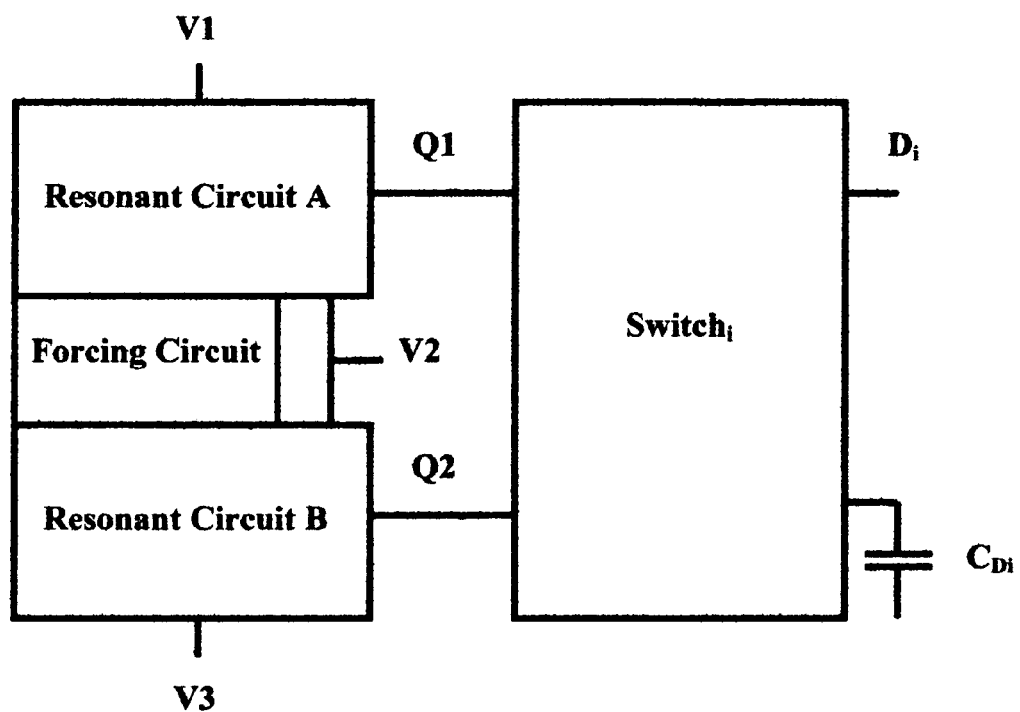
FIG. 2 illustrates the basic configuration for a resonant driver circuit driving a single ended data line $D_i$ through a switch that connects either Q1 or Q2 to the data line and connects the other output to a capacitor load that is equivalent to the load of data line $D_i$.

Preferred Generic Embodiment—FIGS. 1 and 2

FIG. 1 illustrates the basic configuration of a low-power resonant digital data driver circuit. Two resonant circuits A and B drive outputs Q1 and Q2 in oscillation between potentials V2 and V1 and V3 and V2, respectively. V1 is the highest potential voltage and V3 is the lowest potential voltage. V2 is an intermediate voltage that is substantially midway between V1 and V3. Thus Q1, the output of resonant circuit A, oscillates between the intermediate voltage and the highest voltage and Q2, the output of resonant circuit B, oscillates between the intermediate voltage and the lowest voltage. A digital data line connected to Q1, the output of resonant circuit A, will be driven HIGH, while a digital data line connected to Q2, the output of resonant circuit B, will be driven LOW with respect to V2, the intermediate voltage.

For the case of differential digital data transmission, the true data line $D_i$ and the complement data line $D_i$ Bar of the differential signal pair are connected to one or the other of the two outputs of the two resonant circuits. When the true data line $D_i$ is connected to Q1 and the complement data line $D_i$ Bar is connected to Q2, a HIGH or TRUE data state is impressed on the differential signal pair. When the true data line is connected to Q2 and the complement data line is connected to Q1, a LOW or FALSE data state is impressed on the differential signal pair. The setting of Switch$_i$ determines the data state on the differential signal pair. Switch$_i$ has two settings. The first setting connects $D_i$ to Q1 and $D_i$ Bar to Q2 for a HIGH or TRUE data state. The second setting connects $D_i$ to Q2 and $D_i$ Bar to Q1 for a LOW or FALSE data state.

The forcing circuit controls the frequency and phase of the oscillatory outputs of resonant circuit A and resonant circuit B. The forcing circuit also provides additional electrical energy to the resonant circuits to compensate for losses that occur in the parasitic resistances of the circuits.

For the case of single-ended digital data transmission, the outputs of these two resonant circuits are switched to either the data line or to a capacitor of substantially the same size as the data line. If Q1 is connected to the data line and Q2 is connected to the matched capacitor, a HIGH or TRUE data state is impressed on the digital data signal line or node. If Q2 is connected to the data line and Q1 is connected to the matched capacitor, a LOW or FALSE data state is impressed on the digital data signal line or node.

FIG. 2 illustrates the basic configuration for driving a single ended data line, $D_i$. In order to maintain the resonant frequencies of resonant circuit A and resonant circuit B substantially constant, it is necessary to keep the total capacitance substantially constant for each resonant circuit. This means that Switch; must connect Q1 and Q2 to the same capacitance loads independent of the switch setting. This can be accomplished by providing a matching capacitance load, $C_{Di}$, for the single-ended data line. If Switch$_i$ is set to connect Q1 to $D_i$, then Q2 is connected to the matching load $C_{Di}$. If Switch$_i$ is set to connect Q2 to $D_i$, then Q1 is connected to the matching load, $C_{Di}$. The resonant digital data driver circuit for a single-ended data line is the same as for a differential signal pair in all other respects.

Operation—FIGS. 4A, 4B, 7A, 7B, 7C

Figure 4A:
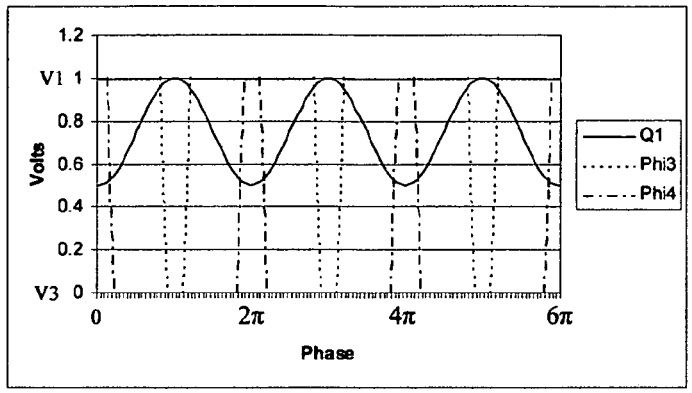
FIGS. 4A, 4B, 4C and 4D show the waveforms corresponding to FIG. 3 for resonant driver outputs, Q1, Q2, Q1 Bar, and Q2 Bar and the control signals, $\phi_1$, $\phi_2$, $\phi_3$, and $\phi_4$ that control the forcing transistors.
Figure 4B:
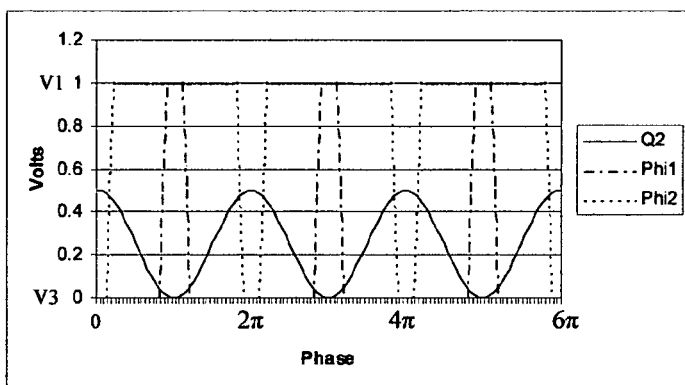
Figure 4C:
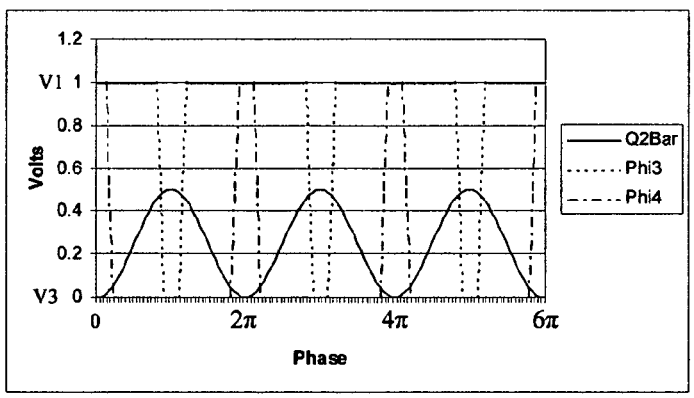
Figure 4D:
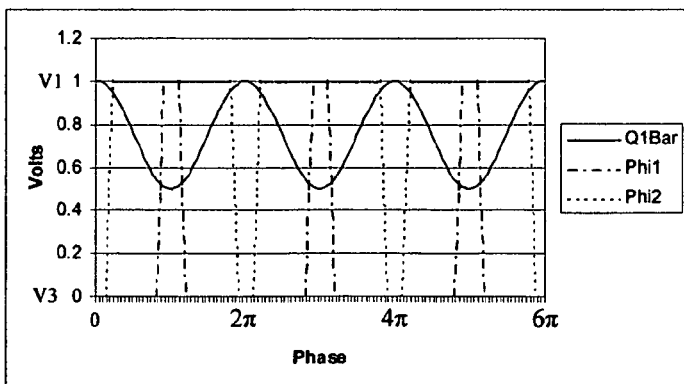

FIGS. 4A and 4B show the waveforms for resonant outputs Q1 and Q2. These figures also show the waveforms for the signals, $\phi_1, \phi_2, \phi_3,$ and $\phi_4$ that control the timing of the forcing circuit. Note that Q1 and Q2 oscillate between different voltages with the intermediate voltage V2 in common. Note that Q1 and Q2 also oscillate 180 degrees or $\pi$ radians out of phase with respect to each other. The result of this phase difference is that Q1 and Q2 are at the same potential (V2) at phase increments of $2\pi$ starting at phase=0. Switch$_i$ makes transitions from one setting to another at these times when Q1 and Q2 are equilibrated at the V2 voltage. This minimizes power dissipation since there is no current flowing when Switch$_i$ is in an intermediate resistance state during the transition between its two possible settings. Switch$_i$ provides a low-resistance path between the data lines and the Q1 and Q2 outputs during the entire period when Q1 is driving up to V1 and back to V2 and when Q2 is driving down to V3 and back to V2. The input circuit or receiver on the data line latches the data when the voltage on the data line is at its maximum or minimum value. This sensing or latching can be performed using any input or receiver circuits defined in prior art. The maxima of Q1 and the minima of Q2 occur regularly at intervals of $2\pi$ radians and in FIGS. 4A and 4B occur at the specific phases $\pi, 3\pi, 5\pi, 7\pi, \ldots$ . Phase angles can be converted into time intervals by taking into account the frequency of operation. For operation at 1 GHz, for example, a phase difference of $2\pi$ corresponds to a time interval of 1 nanosecond.

Forcing control signals in FIGS. 4A and 4B are shown for a CMOS transistor implementation for the sake of clarity, but any switches could be used for the forcing circuit. $\phi_3$ is connected to the pull up on Q1 and $\phi_4$ is connected to the pull down on Q1. $\phi_3$ is LOW turning ON the PMOS pull-up transistor for a brief interval when Q1 is near the V1 voltage. $\phi_4$ is HIGH turning ON the NMOS pull-down transistor for a brief interval when Q1 is near the V2 voltage. In this manner the forcing circuit has low resistance and the smallest possible voltage across the forcing switches whenever current is flowing into the resonant circuit from the supply voltages V1 and V2. This minimizes power dissipation. Similarly $\phi_1$ and $\phi_2$ control the forcing switches for Q2. $\phi_2$ is connected to the pull up on Q2 and $\phi_1$ is connected to the pull down on Q2. $\phi_2$ is LOW turning ON the PMOS pull-up transistor for a brief interval when Q2 is near the V2 voltage. $\phi_1$ is HIGH turning ON the NMOS pull-down transistor for a brief interval when Q2 is near the V3 voltage. In this manner the forcing circuit has low resistance and the smallest possible voltage across the forcing switches whenever current is flowing into the resonant circuit from the supply voltages V2 and V3. This minimizes power dissipation.

FIGS. 7A, 7B, and 7C show the waveforms for Q1 and Q2, the control signals $T_i$ and $C_i$, and the data line outputs $D_i$ and $D_i$ Bar, respectively. This set of waveforms shows how the differential data lines are driven to a HIGH or LOW data state depending on the state of the control signals, $T_i$ and $C_i$.

The outputs of the two resonant circuits, Q1 and Q2 will both be at voltage V2 at one point in time during each cycle of oscillation because they are operated 180 degrees ($\pi$ radians) out of phase. This is graphically illustrated in FIG. 7A. Q1 and Q2 are both at the V2 voltage at phases $0, 2\pi, 4\pi, \ldots$ . This is very important because it enables switching of the switching transistors that comprise the data switch during the time period when there is no potential difference between the data lines and the outputs of both resonant circuits. Switching transistors that connect the digital data lines to one or the other of the resonant circuit outputs make their transitions during this time when the outputs are at the same V2 potential. The control signals, $T_i$ and $C_i$, make their transitions at phases $0, 2\pi, 4\pi, \ldots$ . This is evident in FIG. 7B and the resulting waveforms on the outputs illustrated in FIG. 7C. By the time the output of the first resonant circuit starts to move appreciably above V2 in its transition towards V1 all switching transistors connected to this output are either fully ON or fully OFF. Current flowing though the ON transistors encounters minimum resistance enabling maximum Q. Little or no current flows through the OFF transistors. Similarly, by the time the output of the second resonant circuit starts to move appreciably below V2 in its transition towards V3 all switching transistors connected to this output are either fully ON or fully OFF. Current flowing though the ON transistors encounters minimum resistance enabling maximum Q. Thus the switching transistors that determine whether a data line will be driven HIGH or LOW during a given cycle are only in an intermediate resistance state when all potentials are approximately equilibrated and little or no current is flowing. This minimizes the power dissipation in the switching transistors.

FIG. 7C shows how the true and complement data lines are driven HIGH or LOW depending on the settings of the control signals, $T_i$ and $C_i$. When $T_i$ is HIGH and $C_i$ is LOW, the true data line, $D_i$, follows Q1 HIGH and the complement data line, $D_i$ Bar, follows Q2 LOW. This is the case for the interval 0 to $2\pi$ in FIG. 7C. When $T_i$ is LOW and $C_i$ is HIGH, the true data line, $D_i$, follows Q2 LOW and the complement data line, $D_i$ Bar, follows Q1 HIGH. This is the case for the interval $2\pi$ to $4\pi$ in FIG. 7C. The data switch control signals can be set to either state for each interval corresponding to a full cycle of the resonant circuits. Thus the data switch control signals can impress any arbitrary data stream on the data lines by making the appropriate transitions at phases 0, $2\pi$, $4\pi$, . . . . Data is latched at the input or receiver circuit when the signal amplitude is maximum at phases $\pi$, $3\pi$, $5\pi$, . . . .

ADVANTAGES OF THE PREFERRED GENERIC EMBODIMENT

The driver circuits of the preferred generic embodiment make it possible to drive data lines between three different voltages (V1, V2, and V3) without dissipating the energy E, $E_E=0.5C_{parasitic}V^2$, associated with the potential difference, V, across the parasitic load capacitance of each data line. The resonant circuits alternately cycle the energy stored in the circuit between this electric field energy and the magnetic field energy $E_M=0.5LI^2$ of the inductor. In this manner stored energy in the circuit can be used to change the potentials on the data lines rather than drawing all of this energy out of the power supplies on each cycle. Ordinarily resonant circuits would simply drive the data lines repeatedly back and forth between the same two potentials. This mode of operation does not convey any information. The second essential element of resonant digital data transmission is to devise a means to impress information on the data lines. This is accomplished by means of data switches. These switches connect a particular data line either to Q1 or to Q2. If it is connected to Q1, the data line is driven HIGH. If it is connected to Q2, the data line is driven LOW. The resonant driver circuits are operated in a manner that allows the data switches to change settings when all potentials are substantially equilibrated at the intermediate voltage V2 when no current is flowing. This enables high quality factor Q for the resonant circuits and minimizes power dissipation.

Figure 5A:
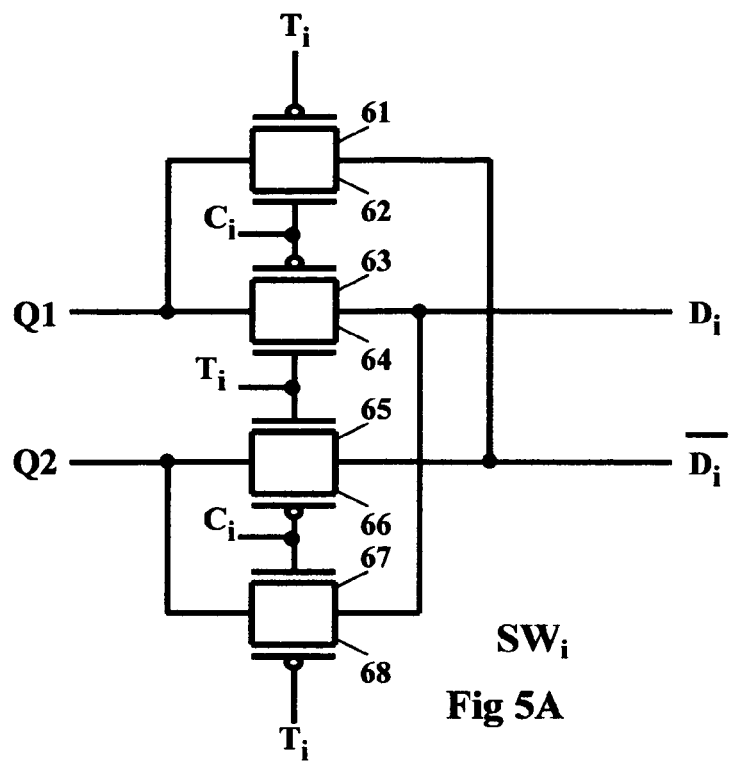
FIG. 5A and FIG. 5B are examples of schematics for switch circuitry that could be used to connect the outputs of the resonant driver circuits to the digital data lines.
Figure 5B:
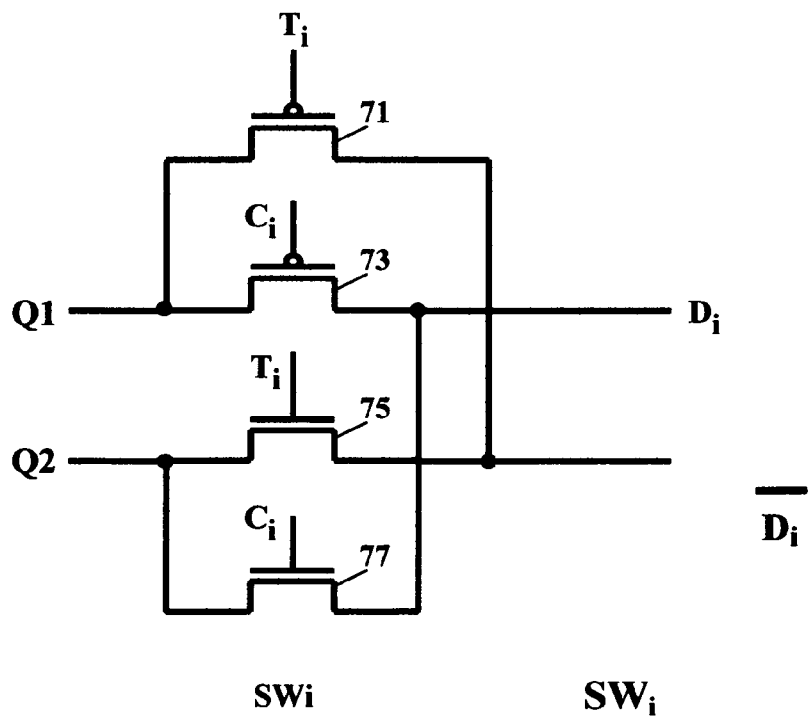

Sample Data Switch Circuits—FIGS. 5A and 5B

FIGS. 5A and 5B are examples of circuits that can be used to implement the data switch. This example is provided in order to clarify the operation of the data switches. Data switches can employ many different circuit implementations and can utilize any type of switching means including any of the known transistor types. This example utilizes Complementary MOS transistors to provide a concrete specific implementation to explain operation but any type of switching means could be used in place of these transistors.

FIG. 5A is an example of the switch circuitry that could be used to connect the outputs of the resonant circuits to the digital data lines, Transistors 63 and 64 connect Q1 to $D_i$ when turned ON by $C_i$ (LOW) and $T_i$ (HIGH), respectively. Transistors 65 and 66 connect Q2 to $D_i$ Bar when turned ON by $T_i$ (HIGH) and $C_i$ (LOW) respectively. Alternatively, transistors 61 and 62 connect Q1 to $D_i$ Bar when turned ON by $T_i$ (LOW) and $C_i$ (HIGH) respectively. Transistors 67 and 68 connect Q2 to $D_i$ when turned ON by $C_i$ (HIGH) and $T_i$ (LOW) respectively.

FIG. 5B is an alternative example of the switch circuitry that could be used to connect the outputs of the resonant circuits to the digital data lines. In this case only the p-channel transistors, 71 and 73, are used to connect the true or complement data lines to Q1 and only the n-channel transistors, 75 and 77, are used to connect the true or complement data lines to Q2. These are the transistors that are turned ON the hardest during most of the transition time. Which alternative is the better choice (5A or 5B) may depend on the technology and the voltages utilized as well as the priorities of area and power tradeoff.

FIG. 5A and FIG. 5B show circuitry for a data line switch, $SW_i$, where i is the $i^{th}$ differential data line pair. The switch circuit shown in FIG. 5A uses both n-channel and p-channel transistors to connect Q1 and Q2 to the data lines. Using both types of transistors may help to reduce the ON resistance of the transistors and improve the Q of the circuit. This is accomplished at the expense of more area and more switching current to drive the gates of the switching transistors. The switch circuit in FIG. 5B uses p-channel transistors to connect Q1 to the data lines and n-channel transistors to connect Q2 to the data lines. Either circuit can be used for the switching the resonant circuit outputs to the data lines based on whichever configuration results in the lower overall power dissipation and acceptable area. Gates of the switching transistors are connected to the control signals $T_i$ and $C_i$. These control signals determine whether the $i^{th}$ data line, $D_i$, is driven HIGH by Q1 or LOW by Q2. The complement data line, $D_i$ Bar, is driven to the complement data state. This operation is described by the truth table for the data switch:

| $SW_i$ | | | |
| --- | --- | --- | --- |
| $T_i$ | $C_i$ | $D_i$ | $D_i$ Bar |
| HIGH | LOW | Driven HIGH | Driven LOW |
| LOW | HIGH | Driven LOW | Driven HIGH |

$T_i$ and $C_i$ are always complements of each other, so no other states are allowed.

Operation of Sample Data Switch Circuits—FIGS. 7A, 7B, and 7C

Waveforms for the data switch circuit, $SW_i$, of FIG. 5A or FIG. 5B are shown in FIGS. 7A, 7B and 7C. FIG. 7A shows the waveforms for Q1 and Q2. FIG. 7B shows the waveforms for the control signals, $T_i$ and $C_i$. FIG. 7C shows the outputs driven onto the data lines $D_i$ and $D_i$ Bar. In FIG. 7A note that Q1 and Q2 are both at the same potential of V2 at phases 0, $2\pi$, $4\pi$, and $6\pi$. In FIG. 7B note that $T_i$ and $C_i$ make their transitions at the point in the cycle when Q1 and Q2 are both equal in potential to V2. This insures that the switching transistors are in their intermediate impedance states only when their source-drain potentials are substantially equal and there is little or no current flow. These switching transistors are fully ON or fully OFF whenever there is significant current flowing into or out of the data lines.

Advantages of Sample Data Switch Circuits—FIGS. 5A,5B, 7A,7B, and 7C

Significant current flows only when Q1 and Q2 make their transitions from V2 to V1 (and back) and from V2 to V3 (and back) respectively. Individual switching transistors are fully OFF whenever the source-drain potential difference for that transistor is substantially greater than zero. This insures minimum resistance in the LRC network formed by the resonant driver circuits and the data switch circuits of FIGS. 5A and 5B enabling maximum Q for this network. FIG. 7C shows the waveforms for the Data lines $D_i$ and $D_i$ Bar. When $T_i$ is HIGH and $C_i$ is LOW, the true data line, $D_i$, follows Q1 HIGH and data line $D_i$ Bar follows Q2 LOW. When $T_i$ is LOW and $C_i$ is HIGH, the true data line $D_i$ follows Q2 LOW and data line $D_i$ Bar follows Q1 HIGH.

Output Driver Circuits Generalized to a Plurality of Parallel Data Switches—FIG. 9A FIG. 9A illustrates how the resonant outputs Q1 and Q2 can be connected to a plurality of data lines by means of a plurality of data switch circuits connected in parallel. FIG. 9A shows the configuration of data switch circuits for n differential signal pairs. The Q1 and Q2 outputs of the resonant driver circuit of FIG. 3 drive n differential signal pairs. Each of the n data switches has independent data switch control signals, $T_1$ and $C_1$, $T_2$ and $C_2$, . . . , $T_n$ and $C_n$, which determine whether the data on a particular differential signal pair is HIGH or LOW for a given cycle of operation of the resonant data driver circuit.

Operation of a Plurality of Parallel Data Switches—FIGS. 7B and 7C

FIGS. 7B and 7C show the operation of a plurality of data switches connected in parallel to resonant outputs Q1 and Q2. There is just one pair of signals Q1 and Q2 as shown in FIG. 7A. There are n copies of FIGS. 7B and 7C so the subscript i in these figures represents the ith pair of data switch control signals and the ith differential pair of true and complement data lines, respectively. In this example the parameter i varies from 1 to n. Transitions of all control signals, $T_i$ and $C_i$, are timed to occur when the Q1 and Q2 outputs are equilibrated at the intermediate potential V2.

Advantages of a Plurality of Parallel Data Switches—FIGS. 9A, 7A, 7B, and 7C

FIGS. 9A, 7A, 7B, and 7C show how one pair of resonant outputs Q1 and Q2 can drive a large number of data lines. This has the advantage that the number of resonant circuits can be greatly reduced. This provides for substantial economy of circuit elements. Parallel data switches also reduce the effective parasitic resistance in the resonant circuits since the equivalent resistance of parallel resistors is always less than the individual resistors. If n resistors of resistance=R1 Ohms are connected in parallel the combined resistance will be R1/n. This reduction of the effective combined resistance in the resonant circuits improves the quality factor Q of the circuit. This reduces the power dissipation and improves the efficiency of the resonant data driver circuits.

Figure 3:
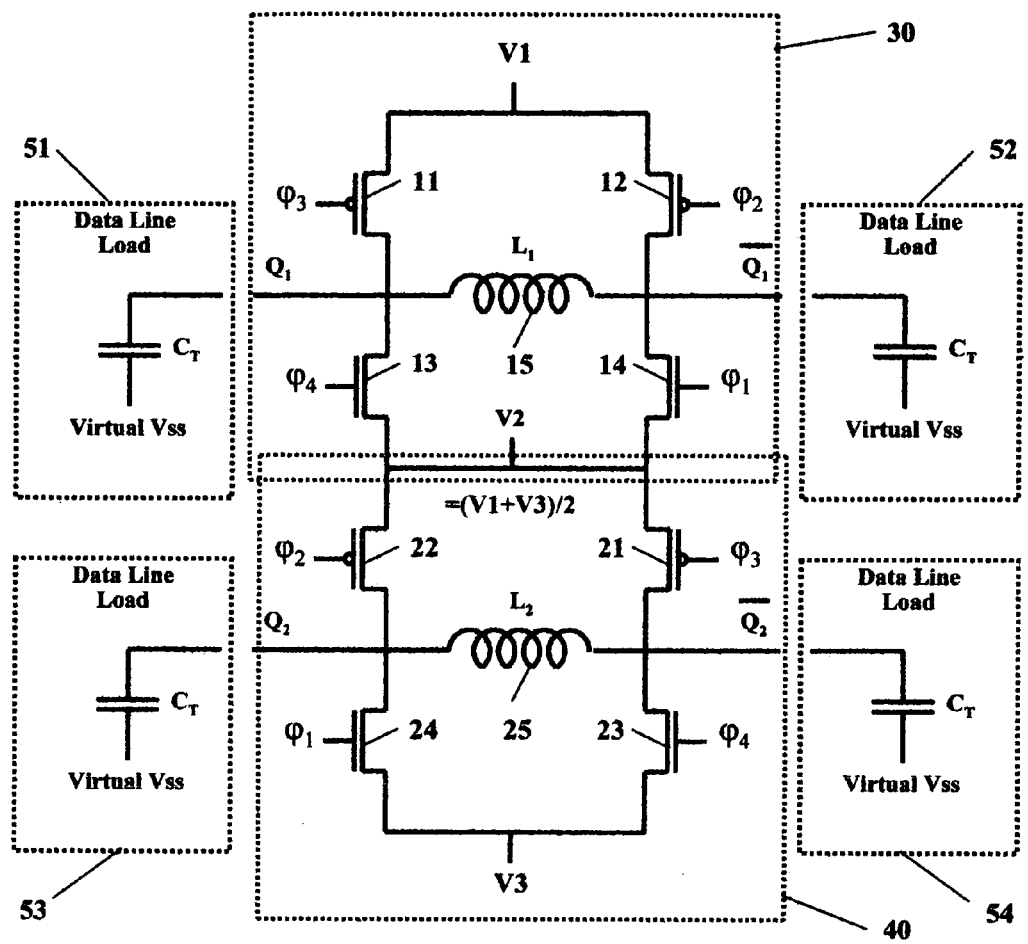
FIG. 3 is a schematic of a circuit that can be used to generate the resonant outputs Q1 and Q2 as well as outputs Q1 Bar and Q2 Bar, which are 180-degrees out of phase with respect to Q1 and Q2.

A Sample Circuit Preferred Embodiment of Resonant Data Driver Circuits—FIG. 3

FIG. 3 is an example of a circuit that can be used to generate the resonant outputs Q1 and Q2. This example is provided in order to clarify the operation of the data driver circuits. Resonant data drivers can employ many different circuit implementations and can utilize any type of switching means including any of the known transistor types. This example utilizes Complementary MOS transistors to provide a concrete specific implementation to explain operation but any type of switching means could be used in place of these transistors.

In addition to generating the resonant outputs Q1 and Q2, this circuit generates Q1 Bar and Q2 Bar which are resonant outputs that oscillate 180 degrees ($\pi$ radians) out of phase with respect to Q1 and Q2. This configuration is especially useful for multiple buffer stages and provides excellent efficiency and economy of circuit elements. Circuit elements in circuit block 30 comprise Resonant Circuits A and C in FIGS. 10A and 10B as well as the forcing circuits associated with these resonant circuits. Circuit elements in circuit block 40 comprise Resonant Circuits B and D in FIGS. 10A and 10B as well as the forcing circuits associated with these resonant circuits. Inductor 15 is connected between Q1 and Q1 Bar. Inductor 25 is connected between Q2 and Q2 Bar. Energy in the magnetic field of these inductors is used to transport charge back and forth between Q1 and Q1 Bar and between Q2 and Q2 Bar. Current always flows in opposite directions in inductors 15 and 25. For balanced loads, inductor L1 (15) and inductor L2 (25), have the same inductance value. This inductance value is selected such that the resonant frequency is close to the frequency of operation of the data lines or nodes in the application. This inductance is calculated from the frequency and the total capacitance loading presented by the data lines and switches. The capacitance C in the LRC circuits comes from the parasitic capacitance loads presented by the data lines and switches. This is represented by the lumped capacitances 51 and 52 for resonant circuit 30 and by the lumped capacitances 53 and 54 for resonant circuit 40. These capacitances are connected to the outputs of the resonant circuits, Q1, Q2, Q1 Bar, and Q2 Bar by means of the data switches which are not shown.

Transistors 11 and 13 comprise the forcing circuitry for Resonant Circuit A of FIGS. 10A and 10B. Transistors 12 and 14 comprise the forcing circuitry for Resonant Circuit C of FIGS. 10A and 10B. Transistors 22 and 24 comprise the forcing circuitry for Resonant Circuit B. Transistors 21 and 23 comprise the forcing circuitry for Resonant Circuit D. Control of all forcing transistors must be synchronized in order to operate all resonant circuits efficiently. Furthermore, the forcing circuitry must be synchronized with the clock domain on the integrated circuit that controls the latching of data on the digital signal lines; hence, all of the forcing transistors are considered to comprise one coordinated forcing circuit that controls the frequency and phase of all resonant circuit outputs. Transistor 11 controls the flow of current between V1 and Q1 and is gated by $\phi_3$. Transistor 21 is analogous to transistor 11 and controls the flow of current between V2 and Q2 Bar and is gated by $\phi_3$. Transistor 13 controls the flow of current between Q1 and V2 and is gated by $\phi_4$. Transistor 23 is analogous to transistor 13 and controls the flow of current between Q2 Bar and V3 and is gated by $\phi_4$. Transistor 12 controls the flow of current between V1 and Q1 Bar and is gated by $\phi_2$. Transistor 22 is analogous to transistor 12 and controls the flow of current between V2 and Q2 and is gated by $\phi_2$. Transistor 14 controls the flow of current between Q1 Bar and V2 and is gated by $\phi_1$. Transistor 24 is analogous to transistor 14 and controls the flow of current between Q2 and V3 and is gated by $\phi_1$. Signals, $\phi_1$, $\phi_2$, $\phi_3$, and $\phi_4$, are synchronized to establish the correct frequency and phase of the oscillations. Each of these signals turns ON their respective transistors for a brief interval when the outputs they control are close to the potentials of the supply to which they connect.

Figure 6A:
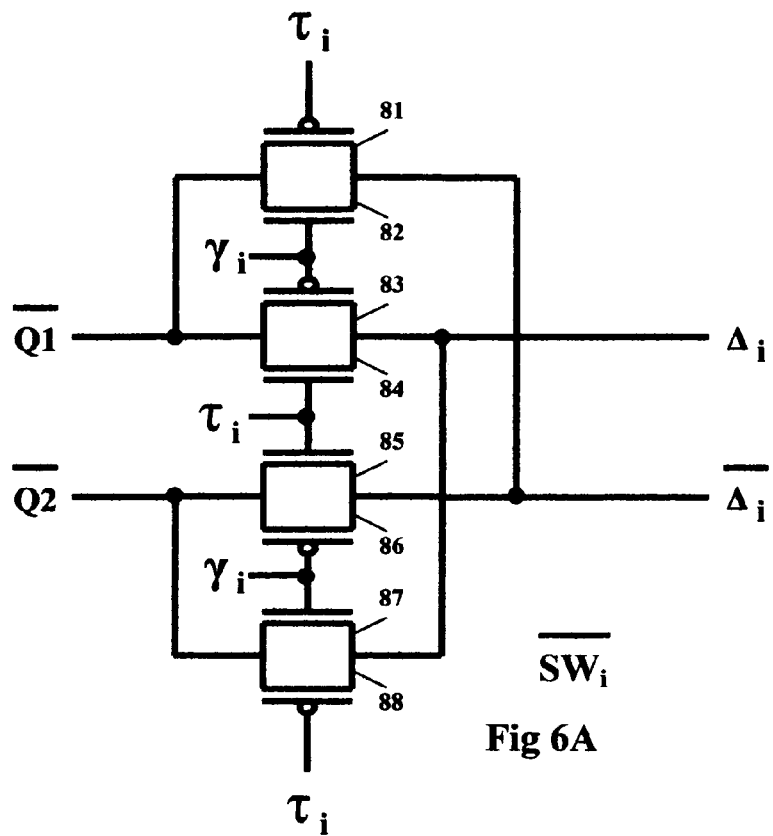
FIG. 6A and FIG. 6B are examples of schematics for switch circuitry that could be used to connect the outputs of the complementary resonant outputs Q1 Bar and Q2 Bar of FIG. 3 to another set of digital data lines that are driven 180-degrees out of phase with respect to the data lines driven by Q1 and Q2.
Figure 6B:
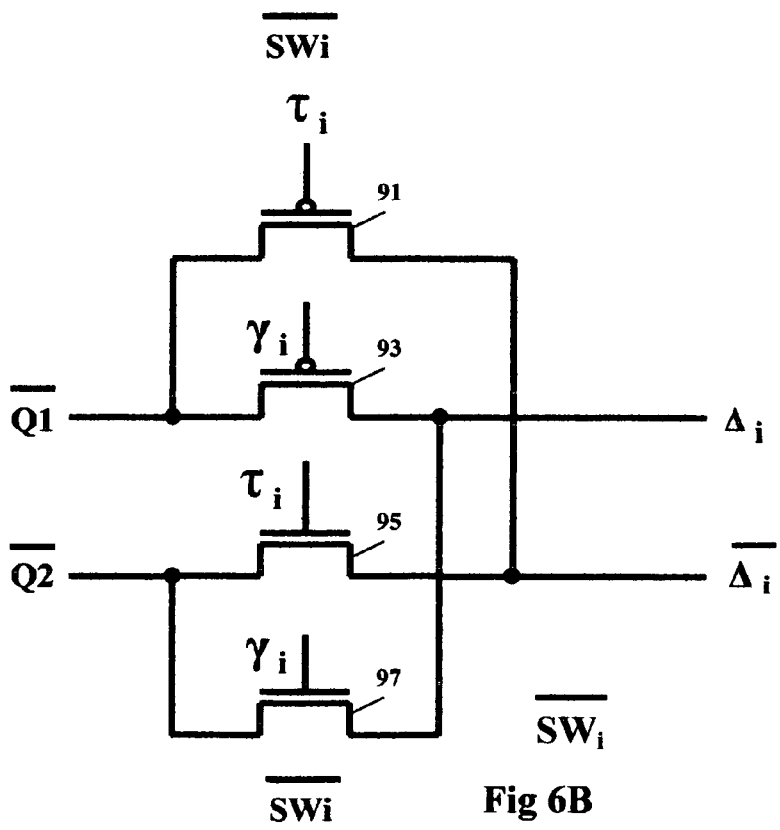

The sample circuit of FIG. 3 can use the same data switch circuits shown in FIGS. 5A and 5B for outputs Q1 and Q2. In addition this circuit also requires data switch circuits that operate 180-degrees out of phase with respect to the data switch circuits connected to outputs Q1 and Q2. This second set of switches is analogous to the switches of FIGS. 5A and 5B and is shown in FIGS. 6A and 6B. These data switches connect the Q1 Bar and Q2 Bar resonant driver outputs to a separate set of data lines that operate 180-degrees out of phase with respect to Q1 and Q2.

FIG. 6A and FIG. 6B are analogous examples of switch circuitry for the complementary resonant outputs Q1 Bar and Q2 Bar of FIG. 3. Timing of the control signals, $\tau_i$ and $\gamma_i$, is 180 degrees ($\pi$ radians) out of phase with respect to the control signals for Q1 and Q2.

In FIG. 6A, transistors 83 and 84 connect Q1 Bar to $\Delta_i$ when turned ON by $\gamma_i$ (LOW) and $\tau_i$ (HIGH), respectively. Transistors 85 and 86 connect Q2 Bar to $\Delta_i$ Bar when turned ON by $\tau_i$ (HIGH) and $\gamma_i$ (LOW) respectively. Alternatively, transistors 81 and 82 connect Q1 Bar to $\Delta_i$ when turned ON by $\tau_i$ (LOW) and $\gamma_i$ (HIGH) respectively. Transistors 87 and 88 connect Q2 Bar to $\Delta_i$ Bar when turned ON by $\tau_i$ (HIGH) and $\gamma_i$ (LOW) respectively.

FIG. 6B correlates with FIG. 5B. In this case only the p-channel transistors, 91 and 93, are used to connect the true or complement data lines to Q1 Bar and only the n-channel transistors, 95 and 97, are used to connect the true or complement data lines to Q2 Bar. These are the transistors that are turned ON the hardest during most of the transition time. Which alternative is the better choice (6A or 6B) may depend on the technology and the voltages utilized as well as the priorities of area and power tradeoff.

FIG. 6A and FIG. 6B show the circuitry for a data line switch, $SW_i$ Bar, where i is the differential data line pair operated 180 degrees ($\pi$ radians) out of phase with respect to the first set of n differential data line pairs. Gates of the switching transistors are connected to the control signals $\tau_i$ and $\gamma_i$. These control signals determine whether the $i^{th}$ data line, $\Delta_i$, is driven HIGH by Q1 Bar or LOW by Q2 Bar. The complement data line, $\Delta_i$ Bar, is driven to the complement data state. This operation is described by the truth table for the data line switch:

| | | $SW_i$ Bar | |
| --- | --- | --- | --- |
| $\tau_i$ | $\gamma_i$ | $\Delta_i$ | $\Delta_i$ Bar |
| HIGH | LOW | Driven HIGH | Driven LOW |
| LOW | HIGH | Driven LOW | Driven HIGH |

$\tau_i$ and $\gamma_i$ are always complements of each other, so no other states are allowed.

Waveforms for the data line switch circuit, $SW_i$ Bar, of FIG. 6A or FIG. 6B are shown in FIGS. 8A, 8B and 8C. FIG. 8A shows the waveforms for Q1 Bar and Q2 Bar. FIG. 8B shows the waveforms for the control signals, $\tau_i$ and $\gamma_i$. FIG. 8C shows the outputs driven onto the data lines $\Delta_i$ and $\Delta_i$ Bar. Note that Q1 Bar and Q2 Bar are both at the same potential of V2 at phases $\pi$, $3\pi$, and $5\pi$. In FIG. 8B note that $\tau_i$ and $\gamma_i$ make their transitions at this point in the cycle when Q1 Bar and Q2 Bar are equipotential. This insures that the switching transistors are in their intermediate impedance states only when their source-drain potentials are substantially equal and there is little or no current flow. These switching transistors are fully ON or fully OFF whenever there is significant current flowing into or out of the data lines. Significant current flows only when Q1 Bar and Q2 Bar make their transitions from V2 to V1 (and back) and from V2 to V3 (and back) respectively. Individual switching transistors are fully OFF whenever the source-drain potential difference for that transistor is substantially greater than zero. This insures minimum resistance in the LRC network formed by the driver circuits of FIG. 3 and the data switch circuits of FIGS. 6A and 6B enabling maximum Q for this network. FIG. 8C shows the waveforms for the Data lines $\Delta_i$ and $\Delta_i$ Bar. When $\tau_i$ is HIGH and $\gamma_i$ is LOW, the true data line, $\Delta_i$, follows Q1 Bar HIGH and data line $\Delta_i$ Bar follows Q2 Bar LOW. When $\tau_i$ is LOW and $\gamma_i$ is HIGH, the true data line, $\Delta_i$, follows Q2 Bar LOW and data line $\Delta_i$ Bar follows Q1 Bar HIGH.

For the resonant digital driver circuits of FIG. 3, best efficiency is achieved if the data lines are divided between Q1, Q2, Q1 Bar, and Q2 Bar so as to balance the loads on each of these outputs. If the data lines represent approximately equal capacitance loads, half of the differential data lines would be driven by Q1 and Q2 through switches $SW_i$, where i=1, 2, 3, . . . n. The other half of the differential data lines would be driven by $Q_1$ Bar and Q2 Bar through switches $SW_i$ Bar, where i=1, 2, 3, . . . n. The total number of differential signal pairs would be N=2n.

Resistance is not explicitly shown in the schematic of FIG. 3 because resistance is not added on purpose to these circuits. Parasitic resistance is distributed throughout the circuits in the metal lines and transistors that comprise the circuits. Higher resistance increases power dissipation so every effort is made to minimize resistance.

Operation of Sample Resonant Driver Circuit—FIGS. 4A, 4B, 4C, 4D, 7A, 7B, 7C, 8A, 8B, 8C A pendulum provides a good mechanical analog for these resonant circuits. Oscillations of the pendulum are maintained by providing a small push to the right for a short time when the pendulum reaches its maximum swing to the right and providing a small push to the left when the pendulum reaches its maximum swing to the left. In this manner small inputs of mechanical energy can maintain large changes in the potential and kinetic energy of the pendulum that occur during each cycle of oscillation of the pendulum against frictional losses that are tending to dampen the harmonic motion. Similarly, for these resonant circuits, large changes in magnetic field energy and electrical field energy during each cycle of oscillation can be maintained with small inputs of electrical energy from the power supplies. In FIG. 3 transistors 11 and 12 provide small tugs up to potential V1 on outputs Q1 and Q1 Bar, respectively at appropriate timing intervals when these outputs are close to V1. Transistors 13 and 14 provide small tugs down to potential V2 on outputs Q1 and Q1 Bar, respectively, at appropriate timing intervals when these outputs are close to V2. Similarly, transistors 22 and 21 provide small tugs up to potential V2 on outputs Q2 and Q2 Bar, respectively, at appropriate timing intervals when these outputs are close to V2. Transistors 24 and 23 provide small tugs down to potential V3 on outputs Q2 and Q2 Bar, respectively, at appropriate timing intervals when these outputs are close to V3. In this manner forcing transistors 11, 12, 13, 14, 21, 22, 23, and 24 maintain voltage swings of constant amplitude on the outputs of the resonant circuits by providing small charge flows in synchronization with the oscillations. These small charge flows replenish the energy loss caused by the parasitic resistances in the circuits. The forcing transistors also keep the resonant circuits in synch with the appropriate clock domain on the integrated circuit. Waveforms for the control signals, $\phi_1$, $\phi_2$, $\phi_3$, and $\phi_4$ that control the gates of the forcing transistors in FIG. 3 are shown in FIGS. 4A, 4B, 4C, and 4D. These figures also show the output waveforms, Q1, Q2, Q1 Bar, and Q2 Bar and their relationship to the waveforms for the control signals of the forcing circuitry.

FIG. 7A shows the waveforms for Q1 and Q2. FIG. 7B shows the waveforms for $T_i$ and $C_i$ which control the setting of the data switch and FIG. 7C shows the resulting waveform on the true and complement data lines, $D_i$ and $D_i$ Bar. FIG. 8A shows the waveforms for Q1 Bar and Q2 Bar. FIG. 8B shows the waveforms for $\tau_i$ and $\gamma_i$ which control the setting of the data switch and FIG. 8C shows the resulting waveform on the true and complement data lines, $\Delta_i$ and $\Delta_i$ Bar. Note that all signals and transitions are 180-degrees out of phase comparing waveforms in FIGS. 7A, 7B, and 7C with waveforms in 8A, 8B, and 8C. The result is that $D_i$ and $D_i$ Bar reach maximum separation at phase angles $\pi$, $3\pi$, $5\pi$, ..., while $\Delta_i$ and $\Delta_i$ Bar reach maximum separation at phase angles 0, $2\pi$, $4\pi$, ... $D_i$ and $D_i$ Bar are equilibrated at the intermediate voltage V2 at phase angles 0, $2\pi$, $4\pi$..., while $\Delta_i$ and $\Delta_i$ Bar are equilibrated at the intermediate voltage V2 at phase angles $\pi$, $3\pi$, $5\pi$, .... This is well suited to signal buffering on long or heavily loaded data lines. The sensing or input stage can latch the signal on $D_i$ and $D_i$ Bar at just the time needed to apply the received data to the switches of the next buffer stage connected to the $\Delta_i$ and $\Delta_i$ Bar data lines which are 180-degrees out of phase. This can be repeated for any number of stages of buffering.

Advantages of a Sample Resonant Driver Circuit—FIGS. 3, 4A, 4B, 4C, 7A, 7B, 7C, 8A, 8B, and 8C The sample circuit of FIG. 3 provides the advantage of significant economy of circuit elements since just two inductors can provide two pairs of resonant driver outputs. This circuit also provides two resonant driver outputs that are 180-degrees out of phase with respect to each other. This is well suited to buffering signals on data lines since data can be latched on one half cycle and applied to the data switches on the next half cycle to set the data state for the subsequent buffer stage. Parasitic resistance is minimized so the Q of the resonant circuits is maximized. This sample circuit can be used with differential signal pairs or with single-ended data lines by providing equivalent capacitor loads for each of the single-ended data lines.

Generalization of the Sample Resonant Driver Circuit to a Plurality of Parallel Data Switches—FIG. 9B Resonant outputs Q1 and Q2 from the circuit of FIG. 3 can be connected to a plurality of data lines by means of a plurality of data switch circuits as shown in FIG. 9A. FIG. 9A illustrates how the resonant outputs Q1 and Q2 can be connected to a plurality of data lines by means of a plurality of data switch circuits connected in parallel. FIG. 9A shows the configuration of data switch circuits for n differential signal pairs. The Q1 and Q2 outputs of the resonant driver circuit of FIG. 3 drive n differential signal pairs. Each of the n data switches has independent data switch control signals, $T_1$ and $C_1$, $T_2$ and $C_2$, ..., $T_n$ and $C_n$, which determine whether the data on a particular differential signal pair is HIGH or LOW for a given cycle of operation of the resonant data driver circuit.

Similarly, resonant outputs Q1 Bar and Q2 Bar from the circuit of FIG. 3 can be connected to a plurality of data lines by means of a second plurality of data switch circuits shown in FIG. 9B that operate 180-degrees out of phase with respect to the switches shown in FIG. 9A. FIG. 9B illustrates how the resonant outputs Q1 Bar and Q2 Bar can be connected to a plurality of data lines by means of a plurality of data switch circuits connected in parallel. FIG. 9B shows the configuration of data switch circuits for n differential signal pairs. The Q1 Bar and Q2 Bar outputs of the resonant driver circuit of FIG. 3 drive n differential signal pairs. Each of the n data switches has independent data switch control signals, $\tau_1$ and $\gamma_1$, $\tau_2$ and $\gamma_2$, ..., $\tau_n$ and $\gamma_n$, which determine whether the data on a particular differential signal pair is HIGH or LOW for a given cycle of operation of the resonant data driver circuit. In this example there are n differential pairs, $\Delta_1$ and $\Delta_1$ Bar, $\Delta_2$ and $\Delta_2$ Bar, ..., $\Delta_n$ and $\Delta_n$ Bar.

Operation of the Sample Resonant Driver Circuit Connected to a Plurality of Parallel Data Switches—FIGS. 4A, 4B, 4C, 4D, 7A, 7B, 7C, 8A, 8B, and 8C FIGS. 4A, 4B, 4C, and 4D show the operation of the resonant outputs and control signals for the forcing circuits as before. FIGS. 7A, 7B, and 7C show the operation of the data switch controls for the Q1 and Q2 outputs. This is the same as the operation described before for the generalization to a multiplicity of data lines connected through a plurality of data switches to resonant outputs Q1 and Q2. FIGS. 8A, 8B, and 8C FIGS. 8B and 8C show the operation of a plurality of data switches connected in parallel to resonant outputs Q1 Bar and Q2 Bar. There is just one pair of signals Q1 Bar and Q2 Bar as shown in FIG. 8A. There are n copies of FIGS. 8B and 8C so the subscript i in these figures represents the ith pair of data switch control signals and the ith differential pair of true and complement data lines, respectively. In this example the parameter i varies from 1 to n. Transitions of all control signals, $\tau_i$ and $\gamma_i$, are timed to occur when the Q1 Bar and Q2 Bar outputs are equilibrated at the intermediate potential V2. These time points occur 180-degrees out of phase with respect to the control signals, $T_i$ and $C_i$. The control signals vary independently for each individual data line.

Advantages of a Plurality of Parallel Data Switches—FIGS. 9A, 9B, 7A, 7B, 7C, 8A, 8B, 8C, 10A and 10B FIGS. 9A, 9B, 7A, 7B, 7C, 8A, 8B, and 8C show how two pairs of resonant outputs Q1 and Q2 and Q1 Bar and Q2 Bar can drive a large number of data lines. This has the advantage that the number of resonant circuits can be greatly reduced. This provides for substantial economy of circuit elements. Parallel data switches also reduce the effective parasitic resistance in the resonant circuits since the equivalent resistance of parallel resistors is always less than the individual resistors. If n resistors of resistance=R1 Ohms are connected in parallel the combined resistance will be R1/n. This reduction of the effective combined resistance in the resonant circuits improves the quality factor Q of the circuit. This reduces the power dissipation and improves the efficiency of the resonant data driver circuits.

FIG. 10A provides an overview of the circuit architecture for resonant circuits with two complementary pairs of resonant outputs driving two sets of differential data lines. FIG. 10B shows the resonant circuits of FIG. 3 connected to single-ended data lines. FIG. 10B also provides an overview of the circuit architecture for resonant circuits with two complementary outputs driving single ended data lines with balancing capacitance loads for each data line. The number of data lines that can be driven in parallel by a single pair of resonant circuits in either case is limited only by the current capacity of the inductor and the common bussing.

ADVANTAGES

The resonant digital driver circuit of FIG. 3 has the advantage of excellent energy efficiency and economy of circuit elements. The price for this optimized efficiency is an extra half-cycle of latency for the second set of n differential data-line pairs. This is evident from the fact that the data lines, $\Delta_i$ and $\Delta_i$ Bar, lag (or lead) data lines $D_i$ and $D_i$ Bar by 180 degrees or π radians. For many systems this additional latency would not affect performance significantly. In fact, this 180-degree phase difference can be used to advantage for data lines with multiple buffer stages. Differential signals driven by Q1 and Q2 reach their maximum separation just when signals driven by Q1 Bar and Q2 Bar are equilibrated at the intermediate potential V2. The differential signal driven by Q1 and Q2 can be latched and applied to the switches controlling connections to Q1 Bar or Q2 Bar. The relative timing is just what is needed to set the state of the Q1 Bar and Q2 Bar switches during the time interval when there is no potential difference or current flowing. This insures maximum power efficiency for driving multiple buffer stages along a long digital signal line. Obviously the next buffer stage can use Q1 and Q2 again to drive the next stage in the buffer sequence along the data line if more than two stages of buffering are needed.

CONCLUSION, RAMIFICATIONS, AND SCOPE

There are numerous ways to implement resonant circuits and interface the outputs of these circuits through switches to digital data lines in order to achieve resonant data transmission using the techniques disclosed here. The resonant digital driver circuits of FIG. 3 have several advantages that optimize efficiency and minimize noise. Waveforms for this circuit are shown in FIGS. 4A, 4B, 4C, and 4D. Inspection of these waveforms shows that the inductor $L_1$ transports charge back and forth between nodes Q1 and Q1 Bar (Q1 Complement) causing the potential on the load capacitances to vary between V1 and V2. Similarly, inductor $L_2$ transports charge back and forth between nodes Q2 and Q2 Bar (Q2 Complement) causing the potential on the load capacitances to vary between V2 and V3. Q1 and Q2 are 180 degrees or π radians out of phase. Q1 oscillates between V1 and V2 while Q2 oscillates between V2 and V3. Similarly Q1 Bar and Q2 Bar are 180 degrees or π radians out of phase. Q1 Bar oscillates between V1 and V2 while Q2 Bar oscillates between V2 and V3. As the designations imply, Q1 and Q1 Bar are 180 degrees or π radians out of phase and oscillate between the same potentials, V1 and V2. Q2 and Q2 Bar are 180 degrees or π radians out of phase and oscillate between the same potentials, V2 and V3.

The pull-up driver transistors connected to nodes Q1 and Q1 Bar only need to draw sufficient charge from V1 to make up for energy that is lost due to the parasitic resistances of the loads (the ON-resistance of the switching transistors plus the parasitic interconnect resistances). Similarly the pull-down driver transistors connected to nodes Q2 and Q2 Bar only need to sink sufficient charge into V3 to make up for energy that is lost due to the parasitic resistances of the loads. Most of the charge needed to charge and discharge the loads presented by the data lines is provided by the inductors, $L_1$ and $L_2$. This reduces the average currents and the peak currents in the V1 and V3 supplies. This reduces the average power dissipation and reduces the noise on the V1 and V3 busses due to reduced IR drop and reduced Ldi/dt due to the parasitic resistance and inductance of the power supply busses. If the data line loads are balanced on the output nodes, Q1 and Q1 Bar and Q2 and Q2 Bar, currents into and out of V2 will also be balanced.

Note that $\phi_4$ turns ON the pull-down driver transistor connected to Q1 (supplying positive charge to V2) at the same time that $\phi_2$ turns ON the pull-up driver transistor connected to Q2 (removing positive charge from V2), $\phi_1$ and $\phi_3$ operate in an analogous manner. This means that the V2 potential can be maintained by a supply with very limited current capacity. In some cases a large capacitor should be sufficient. Note also that the driver transistors are only turned ON when the drain-to-source voltage is near zero. This maximizes the energy efficiency of the data driver circuits. The frequency and phase of the data driver outputs are controlled by the period and phase of the waveforms applied to $\phi_1$, $\phi_2$, $\phi_3$, and $\phi_4$. This enables synchronization of the data drivers with whatever clock domain is desired. Jitter is reduced due to the inherent stability of LRC resonant circuits.

V3 could be set equal to Vss and V1 could be set equal to Vdd for one of the power domains on the chip. This has the advantage of simplicity in power bus muting and in power supply requirements. As previously mentioned, additional energy savings can be achieved if the potential difference between V3 and V1 is minimized. An ideal selection would be Vdd>V1>V2>V3>Vss, where V2 is centered between Vdd and Vss and V1-V3 is set to the smallest potential difference that achieves adequate signal sensing margin. This has the advantage of minimizing power dissipation in the resonant circuits. It also results in significantly reduced "OFF" currents in the switching transistors if the gates of these transistors are driven to full Vss or Vdd levels since Vgs-Vt would be reduced. Subthreshold leakage current decreases exponentially as Vgs-Vt is reduced. Power savings would depend on power supply efficiencies. In addition to potential power savings the overall tradeoff analysis must take into account chip physical design considerations.

In the case of digital data lines with multiple sequential buffer stages, the phase relationship between the true and complement sides of the resonant circuits of FIGS. 3, 10A, and 10B are ideally suited to the timing requirements of multiple buffer stages with minimum timing delay. The signal can propagate through two buffer stages in the period of one oscillation of the resonant circuits.

Specific CMOS circuit implementations have been provided as examples to clarify operation, but other analogous implementations can be devised to implement the resonant data driver circuits including the resonant circuits, forcing circuits, and data switch circuits. Different resonant circuit implementations, different data switch circuits, and different forcing circuit configurations can be devised for these functions. Any switching means can be used to implement these circuits including any known transistor types. The examples cited are not intended to restrict implementations of these circuit functions to the specific examples cited. Also low-power, resonant digital data transmission can be used for any application that requires transporting digital data from one physical location to another either on a given integrated circuit or between integrated circuits over short distances. The techniques can be applied to on-chip data paths or to input/output functions at the interface to an integrated circuit.

The invention claimed is:

1. A low-power digital data driver circuit, comprising:
   a. a first resonant circuit that generates a first output that oscillates between a first highest potential voltage and a second intermediate potential voltage, and
   b. a second resonant circuit that generates a second output that oscillates between said second intermediate potential voltage and a third lowest potential voltage, and
   c. a forcing circuit that drives said first and second resonant circuits at the same frequency which is substantially the same as their common resonant frequency and drives said first resonant circuit 180-degrees out of phase with respect to said second resonant circuit, and d. a differential signal pair consisting of a true data line and a complement data line, and e. a data switch with two settings including a first setting that connects said first output of said first resonant circuit to said true data line of said differential signal pair and connects said second output of said second resonant circuit to said complement data line and a second setting that connects said first output of said first resonant circuit to said complement data line of said differential signal pair and connects said second output of said second resonant circuit to said true data line, and whereby said true data line of said differential signal pair can be driven to said first highest potential voltage as an integral part of said first resonant circuit while said complement data line is driven simultaneously to said third lowest potential voltage as an integral part of said second resonant circuit or vice versa depending on the setting of said data switch, which enables said true data line to be driven either to said first highest potential voltage or to said third lowest potential voltage on sequential cycles of the resonant circuit outputs in response to the settings of said data switch while said complement data line is driven simultaneously to the opposite state with low power dissipation associated with resonant circuits.

2. The low-power digital data driver circuit of claim 1 wherein:
   a. said first resonant circuit is comprised of a first inductor connected in series with said data switch, and
   b. said second resonant circuit is comprised of a second inductor connected in series with said data switch and said second inductor is substantially equal in inductance value to said first inductor, and
   c. said inductance value is set at a predetermined value such that the resonant frequency for the composite circuit including said first resonant circuit, said data switch, and said true data line or said complement data line is substantially equal to the frequency at which data is transmitted on said differential signal pair, and
   d. said second intermediate potential voltage is substantially the mid point between said first highest potential voltage and said third lowest potential voltage, and
   whereby said low-power digital data driver circuit can be implemented readily in any electronic circuit technology.

3. The low-power digital data driver circuit of claim 1 wherein:
   a. said data switch is controlled to be fully turned on whenever current is flowing and fully turned off whenever current is not supposed to flow, and
   b. said data switch only changes state when said first output of said first resonant circuit and said second output of said second resonant circuit are both at or near said second intermediate potential voltage so there is little or no voltage across the switches, and
   c. all switches used in said forcing circuit are controlled to be fully turned on whenever current is flowing and fully turned off whenever current is not supposed to flow, and
   d. all switches used in said forcing circuits only change state when there is little or no voltage across them, and
   whereby power dissipation is minimized because the total resistance of the resonant circuits is minimized thereby maximizing the quality factor of the resonant circuits.

4. The low-power digital data driver circuit of claim 1 wherein:
   a. said forcing circuit is synchronized in frequency and phase with a clock domain on an integrated circuit and whereby the signal on said true data line and said complement data line can be latched when the differential signal on said true data line and said complement data line is maximum and said latched signals can be buffered and retransmitted elsewhere or used in digital logic operations in subsequent circuits on the integrated circuit.

5. The low-power digital data driver circuit of claim 1 further including:
   a. a plurality of differential signal pairs each consisting of a true data line and a complement data line, and
   b. a plurality of data switches connected in parallel with said data switch and having the same possible settings as said data switch and each data switch connecting one of the differential signal pairs of said plurality of differential signal pairs to said first and second outputs of said first and second resonant circuits in the same manner as said data switch, and
   whereby said first and second resonant circuits can drive a plurality of differential signal pairs in parallel, where each differential signal pair can be driven to an independent data state based on the individual settings of each data switch contained in said plurality of data switches and whereby the total resistance of said first resonant circuit and the total resistance of said second resonant circuit are reduced by the parallel combination of resistances of said differential signal pairs, which improves the quality factor of said first and second resonant circuits and reduces the power dissipation per data line.

6. A low-power digital data driver circuit, comprising:
   a. a first resonant circuit that generates a first output that oscillates between a first highest potential voltage and a second intermediate potential voltage, and
   b. a second resonant circuit that generates a second output that oscillates between said second intermediate potential voltage and a third lowest potential voltage, and
   c. a forcing circuit that drives said first and second resonant circuits at the same frequency which is substantially the same as their common resonant frequency and drives said first resonant circuit 180-degrees out of phase with respect to said second resonant circuit, and
   d. a single-ended data line, and
   e. a matching capacitor load having capacitance substantially equal to said single-ended data line, and
   f. a data switch with two settings including a first setting that connects said first output of said first resonant circuit to said single-ended data line and connects said second output of said second resonant circuit to said matching capacitor load and a second setting that connects said first output of said first resonant circuit to said matching capacitor load and connects said second output of said second resonant circuit to said single-ended data line, and
   whereby said single-ended data line can be driven to said first highest potential voltage as an integral part of said first resonant circuit for said first setting of said data switch or said single-ended data line can be driven to said third lowest potential voltage of said second resonant circuit for said second setting of said data switch, which enables said single-ended data line to be driven either to said first highest potential voltage or to said third lowest potential voltage on sequential cycles in response to the settings of said data switch with low power dissipation associated with resonant circuits, while maintaining substantially the same capacitance load on said first resonant circuit and said second resonant circuit at all times so the resonant frequency is not changed.

7. The low-power digital data driver circuit of claim 6 further including:
   a. a plurality of single-ended data lines, and
   b. a plurality of matching capacitor loads each having a capacitance substantially matching the capacitance of its corresponding single-ended data line, and
   c. a plurality of data switches connected in parallel with said data switch and having the same possible settings as said data switch and each data switch connecting one of the single-ended data lines contained in said plurality of single-ended data lines together with its matching capacitor load contained in said plurality of matching capacitor loads to said first and second outputs of said first and second resonant circuits in the same manner as said data switch, and
   whereby said first and second resonant circuits can drive a plurality of single-ended data lines in parallel, where each single-ended data line can be driven to either said first highest potential voltage or to said third lowest potential voltage on sequential cycles based on the settings of said plurality of switches in each cycle and whereby the total resistance of said first resonant circuit and the total resistance of said second resonant circuit are reduced by the parallel combination of resistances of said plurality of single-ended data lines, and whereby the capacitor loads on said first resonant circuit and on said second resonant circuit are maintained substantially constant independent of said data switch settings which maintains a constant resonant frequency and improves the quality factor of the resonant circuits and reduces the power dissipation.

8. A pair of low-power digital data driver circuits, comprising:
   a. a first resonant circuit that generates a first output that oscillates between a first highest potential voltage and a second intermediate potential voltage, and
   b. a second resonant circuit that generates a second output that oscillates between said second intermediate potential voltage and a third lowest potential voltage, and
   c. a third resonant circuit that generates a third output that oscillates 180 degrees out of phase with said first output between said first highest potential voltage and said second intermediate potential voltage, and
   d. a fourth resonant circuit that generates a fourth output that oscillates 180-degrees out of phase with said second output between said second intermediate potential voltage and said third lowest potential voltage
   e. a first differential signal pair consisting of a first true data line and a first complement data line, and
   f. a second differential signal pair consisting of a second true data line and a second complement data line, and
   g. a forcing circuit that drives said first, second, third, and fourth resonant circuits at the same frequency which is substantially the same as their common resonant frequency and drives said first resonant circuit 180-degrees out of phase with respect to said second resonant circuit, and drives said third resonant circuit 180-degrees out of phase with said first resonant circuit, and drives said fourth resonant circuit 180-degrees out of phase with said second resonant circuit, and
   h. a first data switch with two settings including a first setting that connects said first output of said first resonant circuit to said first true data line of said first differential signal pair and connects said second output of said second resonant circuit to said first complement data line and a second setting that connects said first output of said first resonant circuit to said first complement data line of said first differential signal pair and connects said second output of said second resonant circuit to said second true data line, and
   i. a second data switch with two settings including a first setting that connects said third output of said third resonant circuit to said second true data line of said second differential signal pair and connects said fourth output of said fourth resonant circuit to said second complement data line and a second setting that connects said third output of said third resonant circuit to said second complement data line of said second differential signal pair and connects said fourth output of said fourth resonant circuit to said second true data line, and
   whereby said first output of said first resonant circuit and said second output of said second resonant circuit drive said first differential signal pair 180-degrees out of phase with respect to said second differential signal pair which is driven by said third output from said third resonant circuit and said fourth output from said fourth resonant circuit, and this 180-degree phase difference between said first differential signal pair and said second differential signal pair enables convenient buffering of a differential signal on said first differential pair by latching the data from said first differential pair and using the latched data to set said second data switch to drive said second differential pair on a subsequent half cycle with the same data present on said first differential signal pair in the earlier half cycle.

9. The pair of low-power digital data driver circuits of claim 8 further including:
   a. a plurality of phase 1 differential signal pairs each consisting of a true phase 1 data line and a complement phase 1 data line, and
   b. a plurality of phase 2 differential signal pairs each consisting of a true phase 2 data line and a complement phase 2 data line, and
   c. a plurality of phase 1 data switches connected in parallel with said first data switch and having the same possible settings as said first data switch and each phase 1 data switch connecting one phase 1 differential signal pair of said plurality of phase 1 differential signal pairs to said first and second outputs of said first and second resonant circuits in the same manner as said first data switch, and
   d. a plurality of phase 2 data switches connected in parallel with said second data switch and having the same possible settings as said second data switch and each phase 2 data switch connecting one phase 2 differential signal pair of said plurality of phase 2 differential signal pairs to said third and fourth outputs of said third and fourth resonant circuits in the same manner as said second data switch, and
   whereby said first and second resonant circuits can drive a plurality of differential signal pairs in parallel, where each differential signal pair can be driven to an independent data state based on the individual settings of each phase 1 data switch contained in said plurality of phase 1 data switches and said third and fourth resonant circuits can drive a plurality of differential signal pairs in parallel, where each differential signal pair can be driven to an independent data state based on the individual settings of each phase 2 data switch contained in said plurality of phase 2 data switches and the total resistance of said first resonant circuit, the total resistance of said second resonant circuit, the total resistance of said third resonant circuit, and the total resistance of said fourth resonant circuit are reduced by the parallel combination of resistances of said differential signal pairs, which improves the quality factor of said first, second, third, and fourth resonant circuits and reduces the power dissipation per data line.

10. The pair of low-power digital data driver circuits of claim 8, wherein:
   a. said first differential signal pair is modified to consist of a first single-ended data line replacing said first true data line and a first matching capacitor load replacing said first complement data line, and
   b. said second differential signal pair is modified to consist of a second single-ended data line replacing said second true data line and a second matching capacitor load replacing said second complement data line, and
   whereby said first output of said first resonant circuit and said second output of said second resonant circuit can drive said first single-ended data line and said third output of said third resonant circuit and said fourth output of said fourth resonant circuit can drive said second single-ended data line.

11. The pair of low-power digital data driver circuits of claim 8, wherein:
   a. a first inductor has a first terminal connected to said first output of said first resonant circuit and said first inductor has a second terminal connected to said third output of said third resonant circuit, and
   b. a second inductor has a first terminal connected to said second output of said second resonant circuit and said second inductor has a second terminal connected to said fourth output of said fourth resonant circuit, and
   c. said first terminal of said first inductor is connected to a first forcing switch that pulls said first terminal of said first inductor up to said first highest potential voltage and said first terminal of said first inductor is also connected to a second forcing switch that pulls said first terminal of said first inductor down to said second intermediate potential voltage, and
   d. said second terminal of said first inductor is connected to a fifth forcing switch that pulls said second terminal of said first inductor up to said first highest potential voltage and said second terminal of said first inductor is also connected to a sixth forcing switch that pulls said second terminal of said first inductor down to said second intermediate potential voltage, and
   e. said first terminal of said second inductor is connected to a third forcing switch that pulls said first terminal of said second inductor up to said second intermediate potential voltage and said first terminal of said second inductor is also connected to a fourth forcing switch that pulls said first terminal of said second inductor down to said third lowest potential voltage, and
   f. said second terminal of said second inductor is connected to a seventh forcing switch that pulls said second terminal of said second inductor up to said second intermediate potential voltage and said second terminal of said second inductor is also connected to an eight forcing switch that pulls said second terminal of said second inductor down to said third lowest potential voltage, and
   g. said forcing circuit turns said forcing switches on and off
   h. said forcing circuit controls said first forcing switch during a first half cycle to pull up briefly on said first output of said first resonant circuit and during said first half cycle it controls said sixth forcing switch to pull down briefly on said third output of said third resonant circuit and during said first half cycle turns off said second forcing switch and turns off said fifth forcing switch and in a second half cycle said forcing circuit controls said fifth forcing switch to pull up briefly on said third output of said third resonant circuit and during said second half cycle it controls said second forcing switch to pull down briefly on said first output of said first resonant circuit and during said second clock cycle turns off said first forcing switch and turns off said sixth forcing switch thereby forcing said first output of said first resonant circuit to oscillate 180-degrees out of phase with said third output of said third resonant circuit when said first half cycle and said second half cycle are repeated continuously, and
   i. said forcing circuit controls said fourth forcing switch during a first half cycle to pull down briefly on said second output of said second resonant circuit and during said first half cycle it controls said seventh forcing switch to pull up briefly on said fourth output of said fourth resonant circuit and during said first half cycle turns off said third forcing switch and turns off said eighth forcing switch and in a second half cycle said forcing circuit controls said third forcing switch to pull up briefly on said second output of said second resonant circuit and during said second half cycle it controls said eighth forcing switch to pull down briefly on said fourth output of said fourth resonant circuit and during said second clock cycle turns off said fourth forcing switch and turns off said seventh forcing switch thereby forcing said second output of said second resonant circuit to oscillate 180-degrees out of phase with said fourth output of said fourth resonant circuit and thereby forcing said second output of said second resonant circuit to oscillate 180-degrees out of phase with said first output of said first resonant circuit and thereby forcing said fourth output of said fourth resonant circuit to oscillate 180-degrees out of phase with said third output of said third resonant circuit when said first half cycle and said second half cycle are repeated continuously, and
   whereby said pair of low-power differential data driver circuits can be implemented with two inductors providing said first output of said first resonant circuit and said second output of said second resonant circuit and said third output of said third resonant circuit and said fourth output of said fourth resonant circuit and whereby said pair of low-power differential data driver circuits drives said first differential signal pair and said second differential signal pair 180-degrees out of phase which is ideally suited for buffering differential signals for driving over longer distances.

* * * * *